(12) United States Patent
Nienhuys et al.

(10) Patent No.: US 10,216,101 B2
(45) Date of Patent: Feb. 26, 2019

(54) REFLECTOR

(71) Applicant: ASML Netherlands B.V., Veldhoven (NL)

(72) Inventors: Han-Kwang Nienhuys, Veldhoven (NL); Sjoerd Nicolaas Lambertus Donders, Veldhoven (NL); Gosse Charles De Vries, Veldhoven (NL); Michael Jozef Mathijs Renkens, Veldhoven (NL); Erik Roelof Loopstra, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/525,626

(22) PCT Filed: Nov. 4, 2015

(86) PCT No.: PCT/EP2015/075716
§ 371 (c)(1),
(2) Date: May 10, 2017

(87) PCT Pub. No.: WO2016/091486
PCT Pub. Date: Jun. 16, 2016

(65) Prior Publication Data
US 2018/0239252 A1    Aug. 23, 2018

(30) Foreign Application Priority Data

Dec. 12, 2014    (EP) .................................... 14197602

(51) Int. Cl.
| | | |
|---|---|---|
| *G03F 7/20* | (2006.01) | |
| *G02B 5/18* | (2006.01) | |
| *G02B 7/18* | (2006.01) | |

(52) U.S. Cl.
CPC ....... *G03F 7/70891* (2013.01); *G02B 5/1838* (2013.01); *G02B 5/1861* (2013.01);
(Continued)

(58) Field of Classification Search
CPC ............. G03F 7/70891; G03F 7/70825; G03F 7/70958; G03F 7/7015; G03F 7/70858; G02B 7/1815; G02B 7/181; G02B 7/008
See application file for complete search history.

(56) References Cited

U.S. PATENT DOCUMENTS

| | | | | |
|---|---|---|---|---|
| 3,637,296 A | * | 1/1972 | McLafferty | .......... G02B 7/1815 359/845 |
| 4,408,833 A | | 10/1983 | Gowan | |

(Continued)

FOREIGN PATENT DOCUMENTS

| | | |
|---|---|---|
| CN | 1 558 448 A | 12/2004 |
| DE | 102 00 243 A1 | 7/2003 |

(Continued)

OTHER PUBLICATIONS

International Search Report and Written Opinion of the International Searching Authority directed to related International Patent Application No. PCT/EP2015/075716, dated May 12, 2016; 20 pages.
Plöβl et al. "Wafer direct bonding: tailoring adhesion between brittle materials," Reports: A Review Journal, Material Science and Engineering, R25, 1999; pp. 1-88.

*Primary Examiner* — Steven Whitesell Gordon
(74) *Attorney, Agent, or Firm* — Sterne, Kessler, Goldstein & Fox P.L.L.C.

(57) ABSTRACT

A reflector (2) comprising a plate (4) supported by a substrate (8), wherein the plate has a reflective surface (5) and is secured to the substrate by adhesive free bonding, and wherein a cooling channel array (10) is provided in the reflector. The channels (16) of the cooling channel array may (Continued)

be formed from open channels in a surface of the substrate, the open channels being closed by the plate to create the channels.

19 Claims, 9 Drawing Sheets

(52) U.S. Cl.
CPC ......... *G02B 7/1815* (2013.01); *G03F 7/2008* (2013.01); *G03F 7/7095* (2013.01); *G03F 7/70266* (2013.01)

(56) References Cited

U.S. PATENT DOCUMENTS

| | | | |
|---|---|---|---|
| 6,426,968 B1* | 7/2002 | Strife ................... | G02B 7/1815 264/1.9 |
| 2009/0122429 A1* | 5/2009 | Watson ................... | G02B 7/008 359/846 |
| 2011/0051267 A1 | 3/2011 | Kierey et al. | |
| 2014/0307243 A1 | 10/2014 | Sai | |

FOREIGN PATENT DOCUMENTS

| | | |
|---|---|---|
| DE | 10 2006 024 810 A1 | 11/2007 |
| DE | 10 2011 004 446 A1 | 8/2012 |
| JP | 2004-080025 A | 3/2004 |

\* cited by examiner

REFLECTOR

CROSS-REFERENCE TO RELATED APPLICATIONS

This application claims priority of EP 14197602.7 which was filed on Dec. 12, 2014 and which is incorporated herein in its entirety by reference.

FIELD

The present invention relates to a reflector which may form part of a lithographic system. The present invention also relates to a lithographic system.

BACKGROUND

Reflectors are used in EUV lithographic apparatus because EUV radiation is strongly absorbed in most materials and thus transmissive lenses are not practical for EUV lithographic apparatus. When a reflector is used to reflect EUV radiation some of the EUV radiation is absorbed by the reflector (reflection of the EUV radiation is not 100% efficient). Absorption of the EUV radiation by a reflector causes heating of the reflector, and this will in turn cause distortion of the reflector. Distortion of the reflector is undesirable because it will introduce aberrations into the EUV radiation beam. If the reflector is a diffraction grating an undesirable effect of the heating may be to distort the grating such that diffraction orders are no longer generated in a desired manner by the diffraction grating.

It may be desirable to obviate or mitigate at least one problem associated with known reflectors.

SUMMARY

According to a first aspect of the invention there is provided a reflector comprising a plate supported by a substrate, wherein the plate has a reflective surface and is secured to the substrate by adhesive free bonding, and wherein a cooling channel array is provided in the reflector.

The reflector is advantageous because the absence of adhesive between the plate and the substrate allows heat to travel easily into the substrate. The heat can then be removed by liquid flowing through the cooling channel array.

The channels of the cooling channel array may be formed from open channels in a surface of the substrate, the open channels being closed by the plate to create the channels.

Forming the channels in this way is relatively straightforward. It allows channels with sub-millimeter dimensions to be formed.

The adhesive free bonding between the plate and the substrate may comprise direct bonding or optical contact bonding.

The substrate may be an intermediate substrate which is secured by a layer of adhesive to a further substrate.

The intermediate substrate may have a thickness of around 2 mm or less.

The plate and the substrate may be formed from the same material. The material may be semiconductor, metal or metal alloy.

The material may be one of silicon, SiSiC, SiC, copper or Sapphire.

The plate and the substrate may be formed from different materials. For instance, the plate may be formed from one of silicon, SiC, copper or aluminum, while the substrate may be formed from one of zerodur, cordierite, ULE, quartz or invar. Each channel may have a width of 250 microns or more.

Each channel may have a width of less than 1 mm. Each channel may have a width of less than 0.5 mm.

The size of each side of a channel, when viewed in cross-section, may be less than 1000 microns.

Channels of the cooling channel array may be generally rectangular in cross-section.

The plate may be secured upon a curved surface of the substrate.

The reflective surface of the plate may be curved. An opposite surface of the plate may be flat.

The reflector may further comprise an inlet conduit configured to deliver liquid to the cooling channel array and an outlet conduit configured to remove liquid from the cooling channel array.

The reflector may be a mirror or a diffraction grating.

The reflective surface of the plate may comprise a metallic layer.

Channels of the cooling channel array may be formed from open channels in a surface of the substrate, the open channels being closed by an intermediate plate to create the channels. The reflector may further comprise a second cooling channel array, channels of the second cooling channel array being formed from open channels in the intermediate plate, the open channels being closed by a plate.

The plate which closes the open channels in the intermediate plate may be the plate with the reflective surface.

According to a second aspect of the invention there is provided a reflector comprising a reflective surface supported by a substrate, wherein the reflector is provided with actuators, the actuators being configured to apply torque which causes bending of the reflector.

The actuators may be configured to cause at least some concave bending of the reflector.

The actuators may be provided along sides of the reflector.

The actuators may be at least partially located within the reflector.

The reflector may be mounted on mountings which run adjacent to the sides of the reflector. An actuator may be provided which extends between lips which project from the reflector and which are outboard of the mountings, the actuator running generally transverse to the mountings. Lengthening the actuator may cause torque to be applied to the reflector, the torque acting about the mountings.

According to a third aspect of the invention there is provided a reflector comprising a reflective surface supported by a substrate, wherein at least one linear actuator is provided underneath the reflector, the at least one linear actuator being configured to apply force which will least partially counteract outward bending and/or bulging of the reflective surface.

At least partially counteracting outward bending and/or bulging of the reflective surface will reduce aberration of a radiation beam reflected by the reflector.

At least three linear actuators may be provided, a first linear actuator being configured to apply force which pulls the substrate and reflective surface inwards, and second and third linear actuators being configured to apply force which pushes the substrate and reflective surface outwards.

The linear actuators may extend along the length of the reflector.

The reflector may be held by mountings which extend along sides of the reflector.

The mountings may act as pivots about which bending of the reflector may occur.

According to a fourth aspect of the invention there is provided a lithographic system comprising a source of radiation and a lithographic apparatus, wherein a reflector comprising a reflective surface supported by a substrate forms part of the lithographic system and is configured to reflect the radiation beam, wherein a bottom surface of the reflector is provided with a heater which has a footprint that generally corresponds with the footprint of the radiation beam incident on the reflector.

The heater may reduce a thermal gradient across the reflector and may thereby reduce global curvature of the reflector caused by the thermal gradient. This will reduce aberration of a radiation beam reflected by the reflector.

A cooling channel array may be provided in the reflector adjacent to the reflective surface.

An additional cooling channel array may be provided in the reflector adjacent to a bottom surface of the substrate.

According to a fifth aspect of the invention there is provided a lithographic system comprising a source of radiation and a lithographic apparatus, wherein a reflector comprising a reflective surface supported by a substrate forms part of the lithographic system and is configured to reflect the radiation beam, wherein the lithographic system further comprises an additional radiation beam source configured to provide an additional radiation beam to a region of the reflective surface which surrounds or substantially surrounds a footprint of the radiation beam on the reflective surface.

The additional radiation beam will heat the region of the reflective surface which surrounds or substantially surrounds the radiation beam footprint, and thereby reduce or eliminate curvature at edges of the radiation beam footprint. This will reduce aberration of a radiation beam reflected by the reflector The additional radiation beam may heat the region upon which it is incident such that that region has substantially the same temperature as the footprint which is heated by the radiation beam.

The region of the reflective surface upon which the additional radiation beam is incident may be partially outside of the footprint of the radiation beam and may partially overlap with the footprint of the radiation beam.

The intensity of the additional radiation beam may be arranged such that the total heat delivered to the reflector by the combination of the radiation beam and the additional radiation beam is substantially constant at locations where these overlap.

Features of any of the first to fifth aspects of the invention may be combined with each other. A reflector according to any of the first to third aspects of the invention may form part of a lithographic system.

The reflector of any of the aspects of the invention may be a mirror or a diffraction grating.

The radiation beam may be an EUV radiation beam.

BRIEF DESCRIPTION OF THE DRAWINGS

Embodiments of the invention will now be described, by way of example only, with reference to the accompanying schematic drawings, in which.

DETAILED DESCRIPTION

Figure 1:
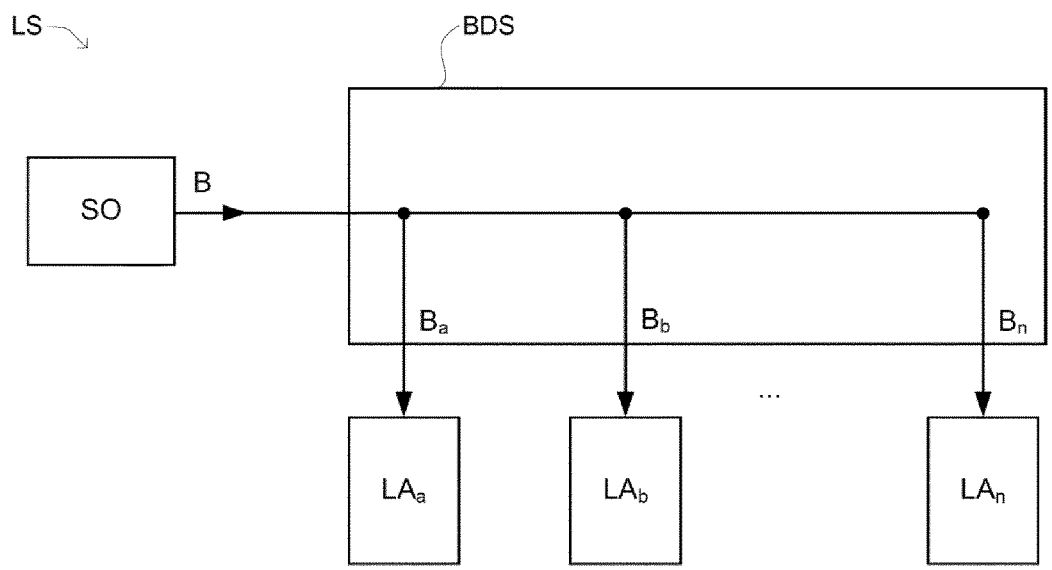
FIG. 1 is a schematic illustration of a lithographic system according to an embodiment of the invention.

FIG. 1 shows a lithographic system LS according to one embodiment of the invention. In general, a lithographic system comprises a radiation source and at least one lithographic apparatus. The lithographic system LS shown in FIG. 1 comprises a radiation source SO, a beam delivery system BDS and a plurality of lithographic tools $LA_a$-$LA_n$. The radiation source SO is configured to generate an extreme ultraviolet (EUV) radiation beam B (which may be referred to as a main beam) and may, for example, comprise at least one free electron laser. Each of the lithographic tools may be any tool which receives a radiation beam. The tools $LA_a$-$LA_n$ are generally referred to herein as lithographic apparatuses, although it will be appreciated that the tools are not so limited. For example, the tools may comprise lithographic apparatuses, mask inspection apparatuses, Arial Image Measurement Systems (AIMS).

The beam delivery system BDS comprises beam splitting optics. The beam splitting optics splits main radiation beam B into n separate radiation beams $B_a$-$B_n$ (which may be referred to as branch beams), each of which is directed to a different one of the n lithographic apparatuses $LA_1$-$LA_n$.

The beam delivery system BDS may further comprise beam expanding optics and/or beam shaping optics. The beam expanding optics may be arranged to increase the cross sectional area of the main radiation beam B and/or the branch radiation beam $B_a$-$B_n$. This decreases the power density of the heat load on mirrors downstream of the beam expanding optics. This may allow the mirrors downstream of the beam expanding optics to be of a lower specification, with less cooling, and therefore less expensive. Further, the lower power density on such mirrors results in less deformation of their optical surfaces due to thermal expansion. Additionally or alternatively, reducing the power density of the heat load on downstream mirrors may allow these mirrors to receive the main radiation beam or the branch radiation beams at a larger grazing incidence angle. For example, the mirrors may receive radiation at a grazing incidence angle of 5 degrees rather than, say, 2 degrees. This is advantageous because it allows the mirrors to be smaller (in a direction which corresponds with the direction of beam propagation as projected onto the surface of the mirror). The beam shaping optics may be arranged to alter the cross sectional shape and/or the intensity profile of the main radiation beam B and/or the branch radiation beams.

In alternative embodiments, the beam delivery system BDS may not comprise beam expanding optics or beam shaping optics.

In some embodiments, the beam delivery system BDS may comprise beam reducing optics, which may be arranged to decrease the cross sectional area of one or more of the main radiation beam B and/or the branch radiation beams. As discussed above, beam expanding optics may reduce the power density of the heat load received by mirrors within the beam delivery system BDS, which may be desirable. However, beam expanding optics will also increase the size of said mirrors, which may be undesirable. Beam expanding optics and beam reducing optics may be used to reach a desired beam size, which may be the smallest beam cross section that results in optical aberrations below a given threshold level.

Figure 2:
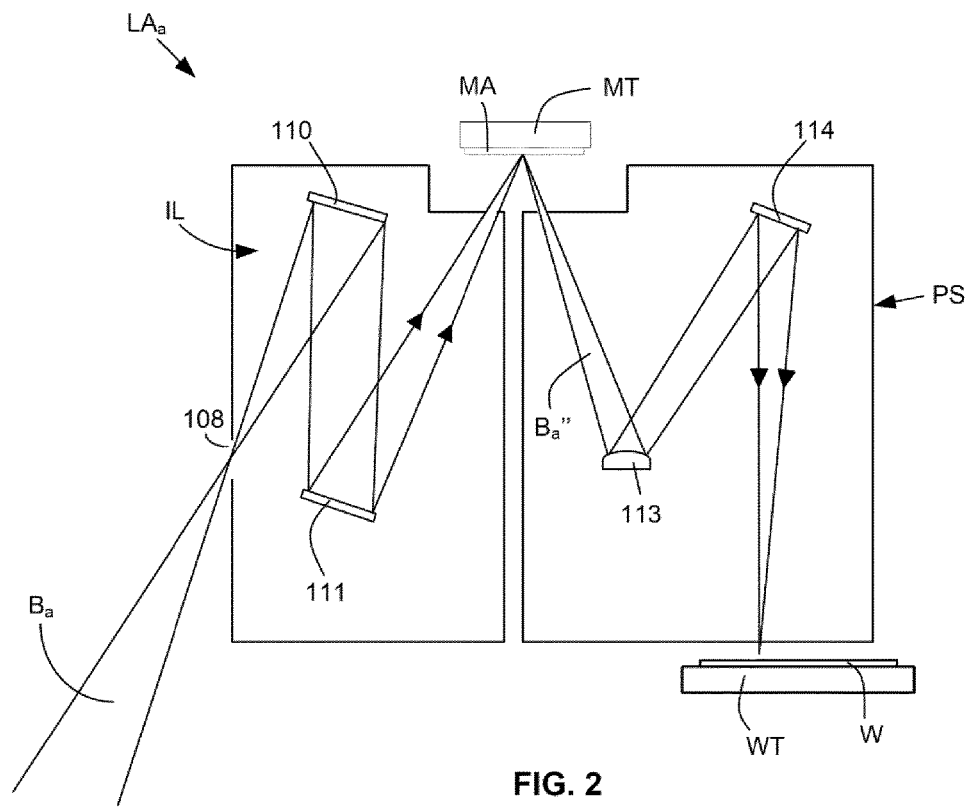
FIG. 2 is a schematic illustration of a lithographic apparatus that may form part of the lithographic system of FIG. 1.

Referring to FIG. 2, a lithographic apparatus $LA_a$ comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus $LA_a$ before it is incident upon the patterning device MA. The projection system PS is configured to project the radiation beam $B_a$" (now patterned by the patterning device MA) onto the substrate W. The substrate W may include previously formed patterns. Where this is the case, the lithographic apparatus aligns the patterned radiation beam $B_a$" with a pattern previously formed on the substrate W.

The branch radiation beam $B_a$ that is received by the lithographic apparatus $LA_a$ passes into the illumination system IL from the beam delivery system BDS though an opening 108 in an enclosing structure of the illumination system IL. Optionally, the branch radiation beam $B_a$ may be focused to form an intermediate focus at or near to the opening 108.

The illumination system IL may include a facetted field mirror device 110 and a facetted pupil mirror device 111. The faceted field mirror device 110 and faceted pupil mirror device 111 together provide the radiation beam $B_a$ with a desired cross-sectional shape and a desired angular distribution. The radiation beam $B_a$ passes from the illumination system IL and is incident upon the patterning device MA held by the support structure MT. The patterning device MA reflects and patterns the radiation beam to form a patterned beam $B_a$". The illumination system IL may include other mirrors or devices in addition to or instead of the faceted field mirror device 110 and faceted pupil mirror device 111. The illumination system IL may for example include an array of independently moveable mirrors. The independently moveable mirrors may for example measure less than 1 mm across. The independently moveable mirrors may for example be microelectromechanical systems (MEMS) devices.

Following redirection (e.g. reflection) from the patterning device MA the patterned radiation beam $B_a$" enters the projection system PS. The projection system PS comprises a plurality of mirrors 113, 114 which are configured to project the radiation beam $B_a$" onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 2, the projection system may include any number of mirrors (e.g. six mirrors).

The lithographic apparatus $LA_a$ is operable to impart a radiation beam $B_a'$ with a pattern in its cross-section and project the patterned radiation beam onto a target portion of a substrate thereby exposing a target portion of the substrate to the patterned radiation. The lithographic apparatus $LA_a$ may, for example, be used in a scan mode, wherein the support structure MT and the substrate table WT are scanned synchronously while a pattern imparted to the radiation beam $B_a$" is projected onto a substrate W (i.e. a dynamic exposure). The velocity and direction of the substrate table WT relative to the support structure MT may be determined by the demagnification and image reversal characteristics of the projection system PS. The patterned radiation beam $B_a$" which is incident upon the substrate W may comprise a band of radiation. The band of radiation may be referred to as an exposure slit. During a scanning exposure, the movement of the substrate table WT and the support structure MT are such that the exposure slit travels over a target portion of substrate W thereby exposing the target portion of the substrate W to patterned radiation. It will be appreciated that a dose of radiation to which a given location within the target portion of the substrate W is exposed depends on the power of the radiation beam $B_a$" and the amount of time for which that location is exposed to radiation as the exposure slit is scanned over the location (the effect of the pattern is neglected in this instance). The term "target location" may be used to denote a location on the substrate which is exposed to radiation (and for which the dose of received radiation may be calculated).

The radiation source SO, beam delivery system BDS and lithographic apparatus $LA_a$-$LA_n$ may all be constructed and arranged such that they can be isolated from the external environment. A vacuum may be provided in at least part of the radiation source SO, beam delivery system BDS and lithographic apparatuses $LA_a$-$LA_n$ so as to minimise the absorption of EUV radiation. Different parts of the lithographic system LS may be provided with vacuums at different pressures (i.e. held at different pressures which are below atmospheric pressure).

Referring again to FIG. 1, radiation source SO is configured to generate an EUV radiation beam B with sufficient power to supply each of the lithographic apparatus $LA_a$-$LA_n$. As noted above, the radiation source may comprise a free electron laser.

A free electron laser comprises an electron source, which is operable to produce a bunched relativistic electron beam, and a periodic magnetic field through which the bunches of relativistic electrons are directed. The periodic magnetic field is produced by an undulator and causes the electrons to follow an oscillating path about a central axis. As a result of the acceleration caused by the magnetic structure the electrons spontaneously radiate electromagnetic radiation generally in the direction of the central axis. The relativistic electrons interact with radiation within the undulator. Under certain conditions, this interaction causes the electrons to bunch together into microbunches, modulated at the wavelength of radiation within the undulator, and coherent emission of radiation along the central axis is stimulated.

The path followed by the electrons may be sinusoidal and planar, with the electrons periodically traversing the central axis, or may be helical, with the electrons rotating about the central axis. The type of oscillating path may affect the polarization of radiation emitted by the free electron laser. For example, a free electron laser which causes the electrons to propagate along a helical path may emit elliptically polarized radiation, which may be desirable for exposure of a substrate W by some lithographic apparatus.

Figure 3:
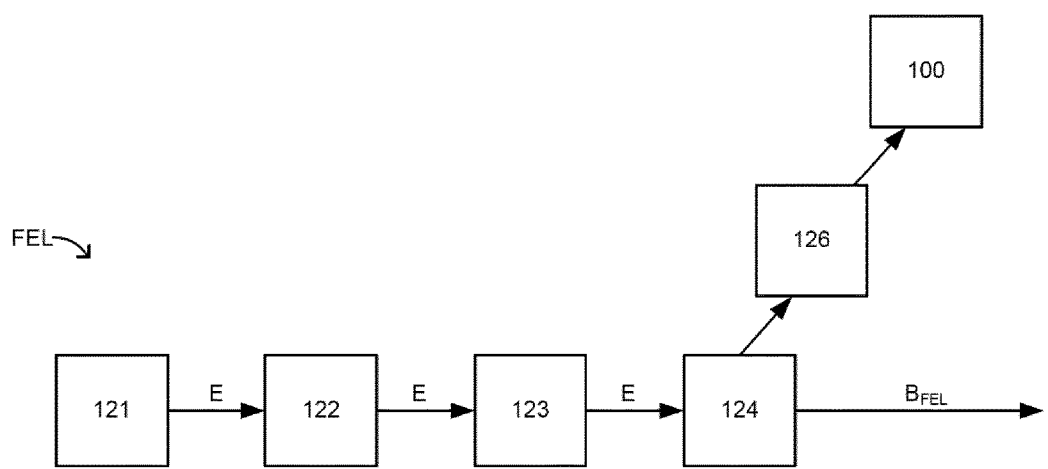
FIG. 3 is a schematic illustration of a free electron laser that may form part of the lithographic system of FIG. 1.

FIG. 3 is a schematic depiction of a free electron laser FEL comprising an injector 121, a linear accelerator 122, a bunch compressor 123, an undulator 124, an electron decelerator 126 and a beam dump 100.

The injector 121 is arranged to produce a bunched electron beam E and comprises an electron source such as, for example, a thermionic cathode or photo-cathode and an accelerating electric field. The injector 121 may comprise an electron gun and an electron booster. The electron gun may comprise a photocathode inside a vacuum chamber which is arranged to receive a pulsed laser beam. Photons in the laser beam are absorbed by the photocathode, excite electrons in the photocathode resulting in emission of some electrons from the photocathode. The photocathode is held at a high negative voltage (for example a voltage of the order of several hundred kilovolts) and thus serves to accelerate electrons which are emitted from the photocathode away from the photocathode, thereby forming a beam of electrons. Since the laser beam is pulsed, the electrons are emitted from the photocathode in bunches, which correspond to the pulses of the laser beam. The electron beam E which is emitted from the photocathode is accelerated by the electron booster. The electron booster may, for example, accelerate electron bunches to energies in excess of approximately 5 MeV. In some embodiments the electron booster may accelerate electron bunches to energies in excess of approximately 10 MeV. In some embodiments the electron booster may accelerate electron bunches to energies of up to approximately 20 MeV.

Electrons in the electron beam E are further accelerated by the linear accelerator 122. In an example, the linear accelerator 122 may comprise a plurality of radio frequency cavities, which are axially spaced along a common axis, and one or more radio frequency power sources, which are operable to control the electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the cavities may be conventionally conducting (i.e. not superconducting), and may be formed from, for example, copper.

The final energy of the beam E can be reached over several acceleration steps. For example, the beam E may be sent through a plurality of linear accelerator modules, which are separated by beam transport elements (bends, drift spaces, etc.). Alternatively, or additionally, the beam E may be sent through the same linear accelerator module repeatedly, with gains and/or losses of energy in the beam E corresponding to the number of repetitions. Other types of linear accelerators may also be used. For example, laser wake-field accelerators or inverse free electron laser accelerators may be used.

The injector 121 and the linear accelerator 122 may be considered to form an electron source operable to produce a bunched electron beam.

The electron beam E passes through a bunch compressor 123, disposed between the linear accelerator 122 and the undulator 124. The bunch compressor 123 is configured to bunch electrons in the electron beam E and spatially compress existing bunches of electrons in the electron beam E. One type of bunch compressor 123 comprises a radiation field directed transverse to the electron beam E. An electron in the electron beam E interacts with the radiation and bunches with other electrons nearby. Another type of bunch compressor 123 comprises a magnetic chicane, wherein the length of a path followed by an electron as it passes through the chicane is dependent upon its energy. This type of bunch compressor may be used to compress a bunch of electrons which have been accelerated in a linear accelerator 122 by a plurality of conductors whose potentials oscillate at, for example, radio frequencies.

The electron beam E then passes through the undulator 124. Generally, the undulator 124 comprises a plurality of modules. Each module comprises a periodic magnet structure, which is operable to produce a periodic magnetic field and is arranged so as to guide the relativistic electron beam E produced by the injector 121 and linear accelerator 122 along a periodic path within that module. As a result, within each undulator module, the electrons radiate electromagnetic radiation generally in the direction of a central axis of their periodic path through that module. The undulator 124 may further comprise a mechanism to refocus the electron beam E, such as a quadrupole magnet in between one or more pairs of adjacent modules. The mechanism to refocus the electron beam E may reduce the size of the electron bunches, which may improve the coupling between the electrons and the radiation within the undulator 124, increasing the stimulation of emission of radiation.

As electrons move through each undulator module, they interact with the electric field of the radiation, exchanging energy with the radiation. In general the amount of energy exchanged between the electrons and the radiation will oscillate rapidly unless conditions are close to a resonance condition, given by:

$$\lambda_{em} = \frac{\lambda_u}{2\gamma^2}\left(1 + \frac{K^2}{A}\right), \quad (1)$$

where $\lambda_{em}$ is the wavelength of the radiation, $\lambda_u$ is the undulator period for the undulator module that the electrons are propagating through, $\gamma$ is the Lorentz factor of the electrons and K is the undulator parameter. A is dependent upon the geometry of the undulator 124: for a helical undulator that produces circularly polarized radiation A=1, for a planar undulator A=2, and for a helical undulator which produces elliptically polarized radiation (that is neither circularly polarized nor linearly polarized) 1<A<2. In practice, each bunch of electrons will have a spread of energies although this spread may be minimized as far as possible (by producing an electron beam E with low emittance). The undulator parameter K is typically approximately 1 and is given by:

$$K = \frac{q\lambda_u B_0}{2\pi mc}, \qquad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through each undulator module. The free electron laser FEL may operate in self-amplified spontaneous emission (SASE) mode. Operation in SASE mode may require a low energy spread of the electron bunches in the electron beam E before it enters each undulator module. Alternatively, the free electron laser FEL may comprise a seed radiation source, which may be amplified by stimulated emission within the undulator 124. The free electron laser FEL may operate as a recirculating amplifier free electron laser (RAFEL), wherein a portion of the radiation generated by the free electron laser FEL is used to seed further generation of radiation.

Electrons moving through the undulator 124 may cause the amplitude of radiation to increase, i.e. the free electron laser FEL may have a non-zero gain. Maximum gain may be achieved when the resonance condition is met or when conditions are close to but slightly off resonance. The radiation produced in the undulator 124 exits the undulator as radiation beam $B_{FEL}$, which may, for example, correspond to the radiation beam B in FIG. 1.

A region around a central axis of each undulator module may be considered to be a "good field region". The good field region may be a volume around the central axis wherein, for a given position along the central axis of the undulator module, the magnitude and direction of the magnetic field within the volume are substantially constant. An electron bunch propagating within the good field region may satisfy the resonant condition of Eq. (1) and will therefore amplify radiation. Further, an electron beam E propagating within the good field region should not experience significant unexpected disruption due to uncompensated magnetic fields.

Each undulator module may have a range of acceptable initial trajectories. Electrons entering an undulator module with an initial trajectory within this range of acceptable initial trajectories may satisfy the resonant condition of Eq. (1) and interact with radiation in that undulator module to stimulate emission of coherent radiation. In contrast, electrons entering an undulator module with other trajectories may not stimulate significant emission of coherent radiation.

For example, generally, for helical undulator modules the electron beam E should be substantially aligned with a central axis of the undulator module. A tilt or angle between the electron beam E and the central axis of the undulator module should generally not exceed $\frac{1}{10}\rho$, where $\rho$ is the Pierce parameter. Otherwise the conversion efficiency of the undulator module (i.e. the portion of the energy of the electron beam E which is converted to radiation in that module) may drop below a desired amount (or may drop almost to zero). In an embodiment, the Pierce parameter of an EUV helical undulator module may be of the order of 0.001, indicating that the tilt of the electron beam E with respect to the central axis of the undulator module should be less than 100 μrad.

For a planar undulator module, a greater range of initial trajectories may be acceptable. Provided the electron beam E remains substantially perpendicular to the magnetic field of a planar undulator module and remains within the good field region of the planar undulator module, coherent emission of radiation may be stimulated.

As electrons of the electron beam E move through a drift space between each undulator module, the electrons do not follow a periodic path. Therefore, in this drift space, although the electrons overlap spatially with the radiation, they do not exchange any significant energy with the radiation and are therefore effectively decoupled from the radiation.

The bunched electron beam E has a finite emittance and will therefore increase in diameter unless refocused. Therefore, the undulator 124 further comprises a mechanism for refocusing the electron beam E in between one or more pairs of adjacent modules. For example, a quadrupole magnet may be provided between each pair of adjacent modules. The quadrupole magnets reduce the size of the electron bunches and keep the electron beam E within the good field region of the undulator 124. This improves the coupling between the electrons and the radiation within the next undulator module, increasing the stimulation of emission of radiation.

An electron which meets the resonance condition as it enters the undulator 124 will lose (or gain) energy as it emits (or absorbs) radiation, so that the resonance condition is no longer satisfied. Therefore, in some embodiments the undulator 124 may be tapered. That is, the amplitude of the periodic magnetic field and/or the undulator period $\mu_u$ may vary along the length of the undulator 124 in order to keep bunches of electrons at or close to resonance as they are guided though the undulator 124. The tapering may be achieved by varying the amplitude of the periodic magnetic field and/or the undulator period $\mu_u$ within each undulator module and/or from module to module. Additionally or alternatively tapering may be achieved by varying the helicity of the undulator 124 (thereby varying the parameter A) within each undulator module and/or from module to module.

After leaving the undulator 124, the electron beam E is absorbed by a dump 100. The dump 100 may comprise a sufficient quantity of material to absorb the electron beam E. The material may have a threshold energy for induction of radioactivity. Electrons entering the dump 100 with an energy below the threshold energy may produce only gamma ray showers but will not induce any significant level of radioactivity. The material may have a high threshold energy for induction of radioactivity by electron impact. For example, the beam dump may comprise aluminium (Al), which has a threshold energy of around 17 MeV. It is desirable to reduce the energy of electrons in the electron beam E before they enter the dump 100. This removes, or at least reduces, the need to remove and dispose of radioactive waste from the dump 100. This is advantageous since the removal of radioactive waste requires the free electron laser FEL to be shut down periodically and the disposal of radioactive waste can be costly and can have serious environmental implications.

The energy of electrons in the electron beam E may be reduced before they enter the dump 100 by directing the electron beam E through a decelerator 126 disposed between the undulator 124 and the beam dump 100.

In an embodiment the electron beam E which exits the undulator 24 may be decelerated by passing the electrons back through the linear accelerator 22 with a phase difference of 180 degrees relative to radio frequency (RF) fields in the linear accelerator 122. The RF fields in the linear accelerator therefore serve to decelerate the electrons which are output from the undulator 24. As the electrons decelerate in the linear accelerator 122 some of their energy is transferred to the RF fields in the linear accelerator 122. Energy from the decelerating electrons is therefore recovered by the linear accelerator 122 and may be used to accelerate the electron beam E output from the injector 121. Such an arrangement is known as an energy recovering linear accelerator (ERL). An example of a free electron laser FEL using an ERL is shown in FIG. 4.

Figure 4:
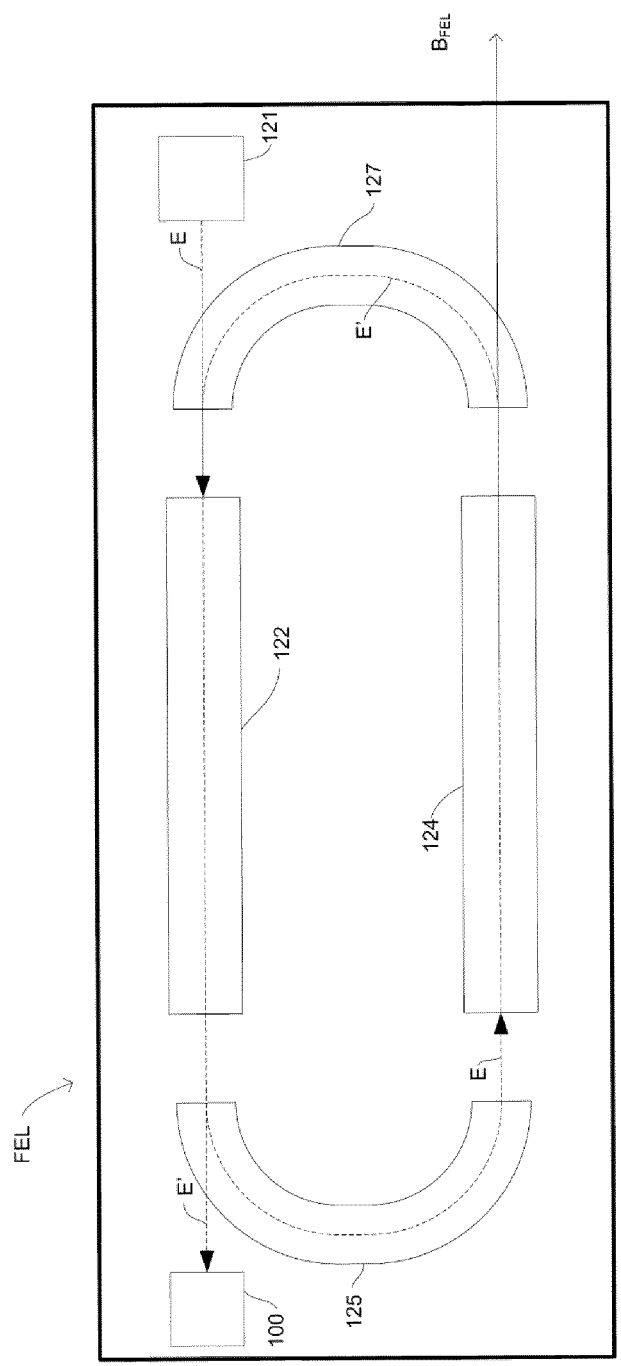
FIG. 4 is a schematic illustration of a free electron laser that may form part of the lithographic system of FIG. 1 and which uses an energy recovery LINAC.

Referring to FIG. 4, the relativistic electron beam E which exits the linear accelerator 122 enters a steering unit 125. The steering unit 125 is operable to alter the trajectory of the relativistic electron beam E so as to direct the electron beam E from the linear accelerator 122 to the undulator 124. The steering unit 125 may, for example, comprise one or more electromagnets and/or permanent magnets configured to generate a magnetic field in the steering unit 125. The magnetic field exerts a force on the electron beam E which acts to alter the trajectory of the electron beam E. The trajectory of the electron beam E upon leaving the linear accelerator 122 is altered by the steering unit 125 so as to direct the electrons to the undulator 124.

In embodiments in which the steering unit 125 comprises one or more electromagnets and/or permanent magnets, the magnets may be arranged to form one or more of a magnetic dipole, a magnetic quadrupole, a magnetic sextupole and/or any other kind of multipole magnetic field arrangement configured to apply a force to the electron beam E. The steering unit 125 may additionally or alternatively comprise one or more electrically charged plates, configured to create an electric field in the steering unit 125 such that a force is applied to the electron beam E. In general the steering unit 125 may comprise any apparatus which is operable to apply a force to the electron beam E to alter its trajectory.

In the embodiment of a free electron laser which is depicted in FIG. 4, the electron beam E' which leaves the undulator 124 enters a second steering unit 127. The second steering unit 127 alters the trajectory of the electron beam E' which leaves the undulator 124 so as to direct the electron beam E' back through the linear accelerator 122. The second steering unit 127 may be similar to the steering unit 125 and may, for example, comprise one or more electromagnets and/or permanent magnets. The second steering unit 127 does not affect the trajectory of the radiation beam $B_{FEL}$ which leaves the undulator 124. The steering unit 125 therefore decouples the trajectory of the electron beam E' from the radiation beam $B_{FEL}$. In some embodiments, the trajectory of the electron beam E' may be decoupled from the trajectory of the radiation beam $B_{FEL}$ (e.g. using one or more magnets) before reaching the second steering unit 127.

The second steering unit 127 directs the electron beam E' to the linear accelerator 122 after leaving the undulator 124. Electron bunches which have passed through the undulator 124 may enter the linear accelerator 122 with a phase difference of approximately 180 degrees relative to accelerating fields in the linear accelerator 122 (e.g. radio frequency fields). The phase difference between the electron bunches and the accelerating fields in the linear accelerator 122 causes the electrons to be decelerated by the fields. The decelerating electrons E' pass some of their energy back to the fields in the linear accelerator 122 thereby increasing the strength of the fields which accelerate the electron beam E arriving from the electron source 121. This arrangement therefore recovers some of the energy which was given to electron bunches in the linear accelerator 122 (when they were accelerated by the linear accelerator) in order to accelerate subsequent electron bunches which arrive from the electron source 121. Such an arrangement may be known as an energy recovering LINAC.

Electrons E' which are decelerated by the linear accelerator 122 are absorbed by beam dump 100. The steering unit 125 may be operable to decouple the trajectory of the electron beam E' which has been decelerated by the linear accelerator 122 from the trajectory of the electron beam E which has been accelerated by the linear accelerator 122. This may allow the decelerated electron beam E' to be absorbed by the beam dump 100 whilst the accelerated electron beam E is directed to the undulator 124.

The free electron laser FEL may comprise a beam merging unit (not shown) which substantially overlaps the trajectories of the beam E coming from the source 121 and the beam E' coming from the steering unit 127. The merging is possible due to the fact that prior to acceleration by the accelerator 122, the energy of the beam E is significantly smaller than the energy of the beam E'. The trajectory of the accelerated electron beam E may be decoupled from the trajectory of the decelerated electron beam E' by generating a substantially constant magnetic field. The difference in energies between the accelerated electron beam E and the decelerated electron beam E' causes the trajectories of the two electron beams to be altered by different amounts by the constant magnetic field. The trajectories of the two electron beams will therefore become decoupled from each other.

Alternatively, the steering unit 125 may, for example, be operable to generate a periodic magnetic field which has a substantially constant phase relationship with the electron bunches which form the accelerated electron beam E and the decelerated electron beam E'. For example at times at which electron bunches from the accelerated electron beam E enter the steering unit 125, the steering unit 125 may generate a magnetic field which acts to direct the electrons to the undulator 124. At times at which electron bunches from the decelerated electron beam E' enter the steering unit 125, the steering unit 125 may generate a magnetic field which acts to direct the electrons to the beam dump 100. Alternatively, at times at which electron bunches from the decelerated electron beam E' enter the steering unit 125, the steering unit 125 may generate little or no magnetic field such that the electrons pass out of the steering unit 125 and to the beam dump 100.

Alternatively the free electron laser FEL may comprise a beam splitting unit (not shown) which is separate from the steering unit 125 and which is configured to decouple the trajectory of the accelerated electron beam E from the trajectory of the decelerated electron beam E' upstream of the steering unit 125. The beam splitting unit may, for example, be operable to generate a periodic magnetic field which has a substantially constant phase relationship with the electron bunches which form the accelerated electron beam E and the decelerated electron beam E'.

When operating as a decelerator, the linear accelerator 122 may be operable to reduce the energy of the electrons E' to below a threshold energy. Electrons below this threshold energy may not induce any significant level of radioactivity in the beam dump 100.

In some embodiments a decelerator (not shown) which is separate to the linear accelerator 122 may be used to decelerate the electron beam E' which has passed through the undulator 124. The electron beam E' may be decelerated by the decelerator in addition to being decelerated by the linear accelerator 122 or instead of being decelerated by the linear accelerator 122. For example, the second steering unit 127 may direct the electron beam E' through a decelerator prior to the electron beam E' being decelerated by the linear accelerator 122. Additionally or alternatively the electron beam E' may pass through a decelerator after having been decelerated by the linear accelerator 122 and before being absorbed by the beam dump 100. Alternatively the electron beam E' may not pass through the linear accelerator 122 after leaving the undulator 124 and may be decelerated by one or more decelerators before being absorbed by the beam dump 100.

The free electron laser FEL may form part of the lithographic system LS of FIG. 1, wherein radiation produced by the free electron laser is ultimately received by one or more substrates W within one or more lithographic apparatus $LA_a$-$LA_n$. These substrates W may be considered to comprise target portions which are arranged to receive patterned radiation. Within the lithographic system LS, radiation is transported from the free electron laser FEL to the substrates via: (i) beam delivery system BDS (for example comprising beam expanding optics and the beam splitting optics); and (ii) optics within the lithographic apparatuses $LA_a$-$LA_n$ (for example optics 110, 111, 113, 114).

The optics of the lithographic system may comprise reflectors. For example, grazing incidence mirrors may be used to deliver the radiation beam B from the free electron laser FEL to the lithographic apparatuses. For example, one or more grazing incidence diffraction gratings may be used to separate the radiation beam into a plurality of radiation beams for delivery to different lithographic apparatuses. Similarly, the optics of the lithographic apparatuses $LA_a$-$LA_n$ may comprise reflectors (e.g. the mirrors for example optics 110, 111, 113, 114 shown in FIG. 2).

Figure 5:
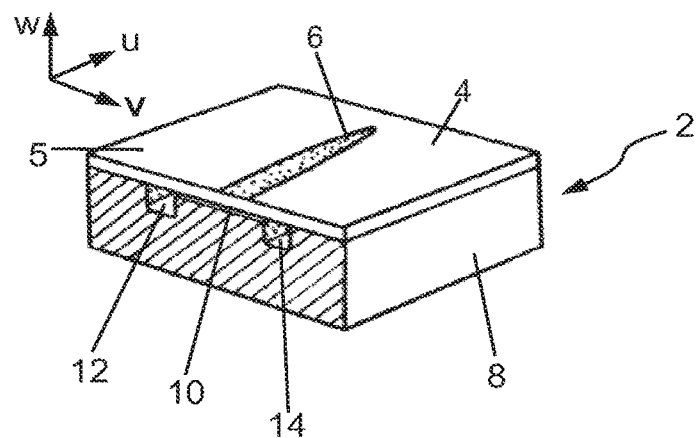
FIG. 5 schematically shows in cross-sectional perspective view a reflector according to an embodiment of the invention.

FIG. 5 is a schematic illustration of a reflector according to an embodiment of the invention. The reflector shown in FIG. 5 is a diffraction grating 2, but in an alternative embodiment the reflector may be a mirror (the term reflector may be considered to encompass mirrors and diffraction gratings). FIG. 5 is a cross-sectional perspective view which shows half of the diffraction grating. The diffraction grating 2 comprises a plate 4 provided on a substrate 8. The surface of the plate 4 is provided with a metallic layer which is reflective for grazing incidence radiation (e.g. EUV radiation). The plate 4 thus has a reflective surface 5. A periodic structure (not shown) with is provided on the plate 4 of the diffraction grating 2. The periodic structure acts to diffract a radiation beam (e.g. EUV radiation) which is incident at a grazing incidence angle upon the diffraction grating 2.

A coordinate system comprising orthogonal u, v and w directions is shown in FIG. 5 and in other figures. This coordinate system is used for convenience when a radiation beam in incident upon a reflector with a grazing incidence angle (grazing incidence may be considered to be when a radiation beam subtends an angle relative to the reflector surface of around 5 degrees or less). For a planar reflector the u-direction corresponds with the direction of propagation of the radiation beam as projected onto the surface of the planar reflector. The v-direction is perpendicular to the u-direction and lies on the surface of the planar reflector. The w-direction is perpendicular to the surface of the planar reflector. The coordinate system is used for convenience and is not intended to be limiting to the orientation of a reflector in a lithographic apparatus or a lithographic system.

The periodic structure of the diffraction grating 2 shown in FIG. 5 may for example comprise lines which extend parallel to the u-direction or may comprise lines which extend at an angle relative to the u-direction.

The radiation beam incident upon the diffraction grating 2 may be generally circular in cross-section or may be elliptical (for example with around 5:1 major/minor axis ratios). In the case of a radiation beam which is circular in cross-section, due to the grazing incidence angle of the radiation beam, the radiation beam has a footprint 6 on the diffraction grating 2 which is significantly longer in the u-direction than in the v-direction (as schematically illustrated by a shaded area). The same may also apply for a radiation beam which is elliptical in cross-section. The footprint 6 of the radiation beam may for example extend over a few tens of centimeters in the u-direction and may extend for example by less than 10 millimeters in the v-direction.

The plate 4 of the diffraction grating may be formed from silicon or some other suitable material. The plate may for example have a thickness of less than 1 mm, e.g. around 0.7 mm. The plate 4 of the diffraction grating 2 is supported by a substrate 8. The substrate 8 may be formed from silicon, or may be formed from some other suitable material. The substrate 8 may for example have a thickness of 20 mm or more. The substrate 8 may for example have a width of around 50 mm or more, and may for example have a length of around 300 mm or less. The plate 4 may for example also have a width of around 50 mm or more, and may for example have a length of around 300 mm or less. The plate 4 may for example be formed from a silicon wafer (e.g. patterned and etched to provide the grating structure of the diffraction grating). In general, the plate 4 may be generally commensurate in length with the footprint 6 of the Radiation beam. The width of the plate 4 may be generally commensurate with the width of the footprint 6 of the Radiation beam, or may be significantly larger than this (for example if the reflector is generally square or generally circular).

Figure 6:
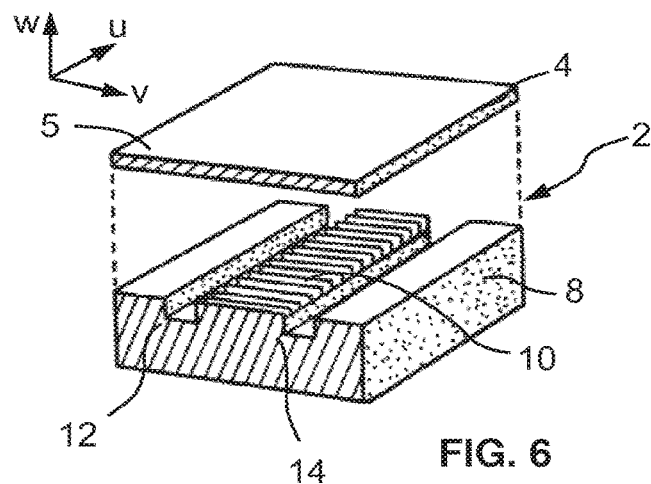
FIG. 6 schematically shows an exploded view of the reflector of FIG. 1.

The substrate 8 is provided with a cooling channel array 10, a liquid inlet conduit 12 and a liquid outlet conduit 14. These may be seen more clearly in FIG. 6. FIG. 6 is an exploded perspective view of part of the diffraction grating 2, with the plate 4 separated from the substrate 8 in order to make the cooling channel array 10 visible. As may be seen from FIG. 6 the channels 10 may be formed as grooves in the substrate 8 and extend between the liquid inlet conduit 12 and the liquid outlet conduit 14, which may also be formed as grooves in the substrate. Thus, neither the channels 10 nor the conduits 12, 14 formed in the substrate 8 have an upper surface but instead are open channels. The plate 4 provides an upper surface for the channels 10 and conduits 12, 14 when it is brought into contact with the substrate 8.

Figure 7:
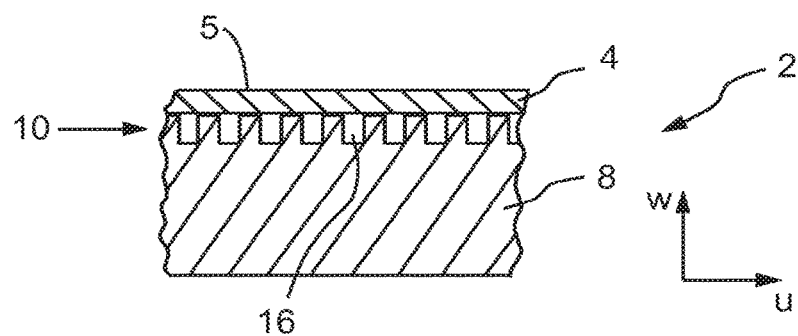
FIG. 7 schematically shows in cross-section the reflector of FIG. 1.

FIG. 7 is a cross-sectional view of the diffraction grating 2 cut along the u-direction and shows the cooling channel array 10 in more detail. As may be seen, each channel 16 has a floor and walls formed from the substrate 8 and has a roof formed from the plate 4. The channels 16 may for example have a pitch of around 500 microns and may for example have a depth of around 500 microns. Each channel may for example have a width of around 250 microns. As mentioned above, the plate 4 may for example have a thickness of around 0.7 mm.

Referring to FIGS. 5-7 in combination, water (or some other liquid) is supplied through the inlet conduit 12, travels through the cooling channel array 10 to the outlet conduit 14 and is removed from the outlet conduit. The water may, for example flow through the diffraction grating 2 at a flow rate of around 3 liters per minute. A radiation beam is incident upon the diffraction grating 2 with a footprint 6 as schematically shown in FIG. 5. Heat from the Radiation beam which is absorbed by the diffraction grating 2 passes to the water which is travelling through the cooling channel array 10. The heated water carries the heat away from the cooling channel array 10, and then flows out of the outlet conduit 14 thereby removing heat from the diffraction grating 2.

Instead of water cooling two-phase cooling, e.g. on the basis of CO2, may be employed to increase the cooling efficiency.

The plate 4 may be fixed to the substrate 8 using adhesive-free bonding. Examples of adhesive-free bonding are optical contact bonding and direct bonding. These forms of adhesive-free bonding use intermolecular forces such as van der Waals forces to bond two surfaces together. Wafer direct bonding is described for example in Plößl, A & Kräuter, G *Material Science and Engineering* R25 (1-2), P1-88 (1999). The upper surfaces of the substrate 8 including upper surfaces of the cooling channel array 10 are made sufficiently smooth that a correspondingly smooth bottom surface of the plate 4 will bond directly onto the substrate. The surfaces which contact each other may be sufficiently smooth that van der Waal's forces (possibly augmented by other forces) attract the surfaces to each other with a strength that will withstand an expected pressure of water in the diffraction grating 2. Thus, the water pressure will not force the plate 4 away from the substrate 8. The water pressure may for example be greater than 2 bar against vacuum.

An advantage of using adhesive free bonding instead of using adhesive to fix the plate 4 to the substrate 8 is that thermal resistance which would arise from the adhesive is avoided. A layer of around 0.1 mm of adhesive may have a thermal resistance equivalent to 60 mm of silicon, and thus would have a substantial negative effect upon the transfer of heat from the plate 4 to other parts of the cooling channel array 10.

Heat which is transferred from the Radiation beam to the silicon plate 4 passes into the walls of the cooling channel array 10 and passes through those walls into the body of the substrate 8. As a result, water travelling through a channel 16 receives heat from the plate 4 which forms the roof of the channel, from walls of the channel and from the floor of the channel. The thermal conductivity of silicon is sufficiently good that the temperature of the walls and floor of the channel 16 is approximately equal to the temperature of the roof of the channel (i.e. the temperature of the plate 4). The cooling channel array 10 provides a surface area for transfer of heat from the diffraction grating 2 to the water which is several times greater (e.g. three or more times greater) than the surface area that would be provided if a conventional single reflector-water interface was used (i.e. if the cooling channel array was not present and water instead flowed through a single wide channel beneath the reflective surface 5). Thus, the cooling channel array 10 provides transfer of heat from the diffraction grating 2 to the water which is significantly more effective than that which will be provided by a conventional reflector-water interface.

Although the plate 4 and substrate 8 are referred as being formed from silicon, they may be formed from any suitable material. However, silicon is advantageous because it is a common material with a relatively high thermal conductivity and a relatively low thermal expansion coefficient. In addition, adhesive free bonding may be used to hold the plate 4 and substrate 8 together. Alternative semiconductor materials may be used, for example SiSiC or SiC. Again, adhesive free bonding may be used. An interface layer of silicon may be provided on the surfaces of the SiSiC or SiC prior to using adhesive free bonding. Copper, which also has a relatively high thermal conductivity (but a higher thermal expansion coefficient than silicon) may be used to form the plate 4 and substrate 8. Adhesive free bonding may be used to hold the copper plate and substrate together. Sapphire (aluminium oxide) may be used to form the plate 4 and substrate 8. Sapphire has a relatively high thermal conductivity but also a relatively high thermal expansion coefficient (compared with silicon). Adhesive free bonding may be used to hold the Sapphire plate and substrate together. Aluminum may be used to form the plate 4 and the substrate 8. The aluminum plate and substrate may be held together using adhesive free bonding. Nickel may be used to form the plate 4 and the substrate 8. The nickel plate and substrate may be held together using adhesive free bonding.

The plate 4 and the substrate 8 may be formed from the same material or from different materials. In the latter case, the plate 4 may be formed from material having a relatively high thermal conductivity and the substrate 8 may be formed from material having a relatively low thermal conductivity. By forming the plate 4 from material having a relatively high thermal conductivity, e.g. silicon, SiC, copper or aluminum, heat is effectively transferred from the surface to the cooling channels. By forming the substrate 8 from material having a relatively low thermal conductivity, e.g. zerodur, cordierite, ULE, quartz or invar, thermal expansion of the substrate is largely prevented as the heat will penetrate the substrate only to a relatively limited extent.

Although the materials referred to above are described in connection with the embodiment shown in FIGS. 5-7 they may be used in connection with any embodiment of the invention.

The channel dimensions referred to above are merely examples, and other dimensions may be used. This applies both in connection with the embodiment shown in FIGS. 5-7 and in connection with other embodiments of the invention. In general, increasing the surface area provided by the channels per unit surface area of the plate 4 will improve the efficiency with which heat is transferred from the diffraction grating 2 (or mirror) to water in the channels (the contact surface area between the channels and the water is increased). However, if the width of the channels is reduced from 250 microns, the pressure required to push water through the channels will increase significantly. In addition, in terms of manufacturability it may be possible to cut channels with a width of around 250 microns into the substrate using a blade, but cutting channels which are significantly narrower than this may require other techniques which may be more expensive and may be more difficult to implement (e.g. etching). Similarly, it may be difficult to form walls with a width less than around 250 microns between channels. Again, however, this may for example be done using etching or other techniques. It may be easier to form channels with a width less than 250 microns than it is to form walls with a width less than 250 microns. Although channels with a width less than 250 microns may be provided (e.g. channels with a width of as little as 100 microns), advantages mentioned above arise from not making the channels significantly narrower than 250 microns. Although walls with a width less than 250 microns may be provided (e.g. walls with a width of as little as 100 microns), it is easier to make walls with a width of 250 microns or more.

The channels may be made wider than 250 microns. Doing this will reduce the density of the channels, and thus reduce the contact surface area for transferring heat from the diffraction grating 2 to the water flowing through the channels. Nevertheless, channels which are wider than 250 microns may still provide significantly more efficient transfer of heat from the diffraction grating 2 to water than, for example, would be the case if water were flowing through a flat unstructured space behind the plate (i.e. if the microstructure were not present). The channels may for example have a width of less than 1 mm. The channels may for example have a width of around 0.5 mm or less.

The surface area through which heat is transferred from the diffraction grating 2 to water may be increased by increasing the depth of the channels. A benefit this approach is that increasing the surface area does not increase the pressure required to push water though the cooling channel array. In addition, blades may still be used to cut grooves forming the microstructure.

A single channel 16 may be defined in terms of a perimeter around its cross-section. Referring to FIG. 7, the perimeter around the cross-sectional of the illustrated channel is 250 microns (floor)+500 microns×2 (walls)+250 microns (roof), i.e. a total cross-sectional perimeter of 1.5 mm. In embodiments of the invention channels of a cooling channel array may, for example, have a cross-sectional perimeter of around 1 mm or more. The channels may, for example, have a cross-sectional perimeter of around 3 mm or less, and may be 2 mm or less. The pitch of channels of the cooling channel array may, for example, be 2 mm or less, and may for example be 1 mm or less. The pitch of the channels of the cooling channel array may, for example, be 250 microns or more.

It may be the case that the size of each side of a channel, when viewed in cross-section, can be expressed in terms of microns which do not exceed hundreds of microns (i.e. can be expressed in terms of less than 1000 microns). Where this applies the channels may be described as microchannels.

The channels of the cooling channel array may, for example, be generally rectangular in cross-section. A generally rectangular cross-section provides more contact area between a channel and water than, for example, a generally circular cross-section. The cooling channel array may have some other non-circular cross-sectional shape. It may have a non-elliptical cross-sectional shape.

Although the above embodiment of the invention has been described in the context of a diffraction grating, embodiments of the invention may comprise a mirror instead of a diffraction grating.

Embodiments of the mirror may comprise a flat mirror or a curved mirror. In an embodiment, a curved mirror may be formed by shaping the substrate 8 to provide a desired curvature and then bending the plate 4 before it is bonded onto the substrate. In an alternative embodiment, the substrate 8 may be flat and the desired curvature may be polished into the plate 4. A potential disadvantage of this second embodiment is that the extent to which curvature can be polished into the plate is limited by the thickness of the plate. However, a grazing incidence mirror may be provided with a useful curvature (e.g. as a focusing mirror with a focal length of around 1 m for a grazing incidence angle of 1 degree and a beam diameter of 5 mm), and may have a difference in thickness between edges and centre of the mirror of less than around 0.4 mm. Thus, the second embodiment allows practically useful curved mirrors to be made.

Figure 8:
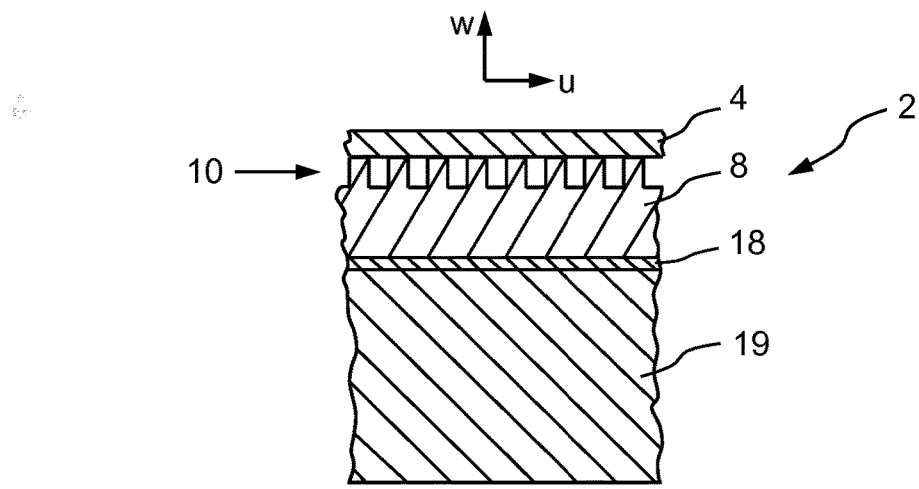
FIG. 8 schematically shows in cross-section a reflector according to an alternative embodiment of the invention.

As noted further above, the thermal resistance of adhesive is very much greater than the thermal resistance of silicon (e.g. by a factor of several hundred). This difference in thermal resistance may be used to provide some thermal isolation in the diffraction grating, for example as shown schematically in FIG. 8. FIG. 8 shows a diffraction grating 2 in cross-section. In FIG. 8 the cooling channel array 10 is formed in an intermediate substrate 8 which is secured to a further substrate 19 using a layer of adhesive 18. The intermediate substrate 8 may, for example, have a thickness of around 2 mm or less. The amount of deformation of the intermediate substrate 8 that will occur is a product of the temperature gradient across the intermediate substrate and the thickness of the intermediate substrate. Because the intermediate substrate 8 is thin, the amount of deformation of the intermediate substrate caused by a temperature gradient across it is small (compared with the amount of deformation that would be seen for a thicker intermediate substrate). The further substrate 19, which is thermally isolated from the intermediate substrate 8 by the adhesive 18, has a substantially uniform temperature and thus does not undergo significant deformation.

Figure 9:
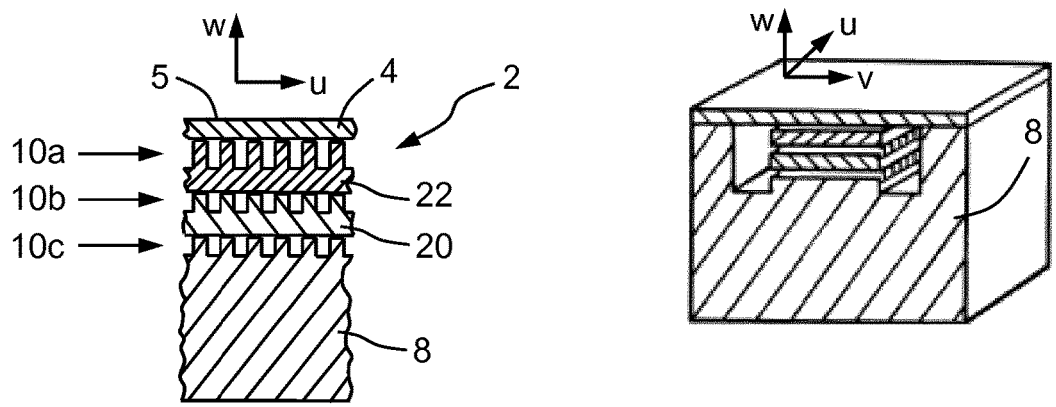
FIG. 9 schematically shows in two cross-sections a reflector according to an alternative embodiment of the invention.

In an embodiment shown in FIG. 9 a plurality of layers of cooling channel arrays may be provided (three layers of cooling channel arrays 10a-10c are illustrated). The cooling channel arrays shown in FIG. 9 may, for example, be created by forming grooves in a substrate 8, forming grooves in a silicon plate 20 and bonding the silicon plate 20 onto the substrate 8 using adhesive free bonding (e.g. direct bonding). Grooves may be formed in another plate 22 which may then be bonded on top of the first plate 20 using adhesive free bonding. A plate 4 may then be bonded on top of the second plate 22 using adhesive free bonding. As will be appreciated, providing additional arrays of channels in this manner increases the contact surface area for transfer of heat to water per unit area of the plate 4. This allows more heat to be carried away via the cooling channels 10a-10c and thus reduces the amount of heat which passes to the substrate 8. This in turn reduces a temperature gradient which may arise in the substrate 8, thereby reducing deformation of the substrate. Any number of arrays of channels may be provided, although complexity of manufacture will increase as the number of arrays increases.

Different forms of reflector distortion may be caused by heat transferred from an incident radiation beam. In one form, heat delivered to a reflecting surface of the reflector gives rise to a thermal gradient between the reflective surface and the bottom of a substrate on which the reflective surface is provided. As a result, the reflective surface will expand by a larger amount than the bottom of the substrate. This will cause convex curvature of the reflector to take place. This form of deformation may be referred to as global curvature.

A different form of curvature may be referred to as local curvature. Referring to FIG. 5, the area of a reflector 2 upon which a radiation beam is incident (footprint 6) will be heated more than areas of the reflector upon which the radiation beam is not incident. Localized expansion of the illuminated area will occur as a result. This will cause bending of the reflector at the illuminated area, such that the illuminated area bulges outwards relative to the surrounding area which is not illuminated. Since the bending of the reflector is localised this deformation may be referred to as local curvature.

Reflectors may suffer from global curvature and/or local curvature. Embodiments of the invention may reduce global curvature and/or local curvature of a reflector. The dominant form of curvature of a reflector may depend on the design of that reflector. For example, the dominant form of curvature may depend upon the effectiveness of a cooling channel array 10, the thickness of the entire reflector, and/or the fraction of the reflector that is illuminated by the radiation beam (in the v direction).

Figure 10:
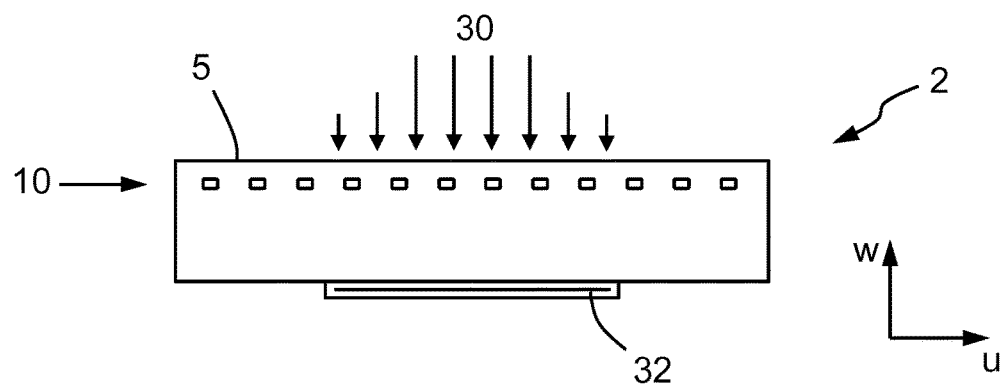
FIG. 10 schematically shows in cross-section a reflector according to an alternative embodiment of the invention.

FIG. 10 shows schematically in cross-section a reflector 2 provided with a cooling channel array 10 adjacent to a reflective surface 5 of the reflector. The reflector 2 may for example correspond with the embodiment shown in FIGS. 5-7. Heat is removed from the reflector 2 by water flowing through the cooling channel array 10. Arrows 30 schematically indicate the area of the plate which is illuminated by a radiation beam. As is schematically indicated by the arrows 30, the intensity of the radiation beam reduces towards its edges. A heater 32 is provided on a bottom surface of the reflector 2. In this embodiment the heater is a resistive heater 32 but any suitable form of heater may be used. The resistive heater 32 has a footprint which generally corresponds with the footprint of the radiation beam 30 incident on the reflector 2. The resistive heater 32 is configured to deliver heat which substantially balances the heat which is transferred from the incident radiation beam 30 to the reflector 2. In this context, because the thickness of the reflector below the cooling channel array 10 is greater than the thickness of the reflector above the cooling channel array, more heat should be delivered to the bottom surface of the reflector, in order to balance the effect of that heat with the effect of the heat delivered to the top surface of the reflector. The spatial distribution of the heat delivered by the resistive heater 32 may substantially correspond with the spatial distribution of the heat delivered by the radiation beam 30.

If the resistive heater 32 were not present then a thermal gradient from the top of the reflector 2 to the cooling channel array 10 would cause global curvature of the reflector. However, by providing heat on the bottom surface of the reflector 2 using the resistive heater 32, and arranging for the heat to substantially balance the heat delivered by the radiation beam 30, global curvature in the opposite direction is applied. The global curvatures at least partially cancel each other out, thereby reducing the net global curvature of the reflector 2. Some global curvature may remain because the heat distribution within the reflector 2 is not symmetric due to there being no cooling channel array adjacent to the bottom of the reflector.

Figure 11:
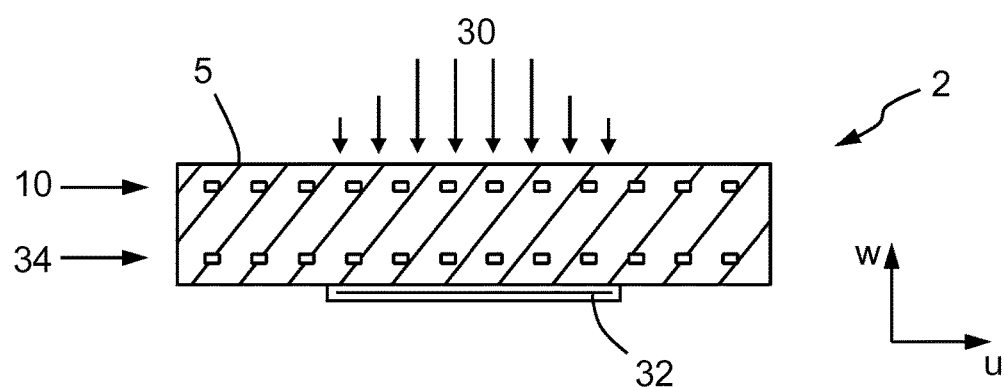
FIG. 11 schematically shows in cross-section a reflector according to an alternative embodiment of the invention.

FIG. 11 shows schematically in cross-section a reflector 2 which generally corresponds with the reflector shown in FIG. 10, but which includes a second cooling channel array 34 provided adjacent to the bottom of the reflector (in addition to a cooling channel array 10 adjacent to a reflective surface 5 of the reflector). In common with the embodiment shown in FIG. 10, heat is transferred to the reflector 2 from a radiation beam 30. Heat is also provided to the bottom of the reflector 2 by a resistive heater 32. The resistive heater 32 has a footprint which generally corresponds with the footprint of the radiation beam 30 incident on the reflector 2. The resistive heater 32 is configured to provide heat to the bottom of the reflector 2, the heat substantially corresponding with the heat transferred to the reflector by the radiation beam 30. The quantity of heat provided by the resistive heater 32 may substantially correspond with the quantity of heat delivered by the incident radiation 30. The spatial distribution of the heat delivered by the resistive heater 32 may substantially correspond with the spatial distribution of the heat delivered by the radiation beam 30.

Heat is removed from the reflector 2 by water flowing through the cooling channel arrays 10, 34. The cooling channel arrays are configured to provide corresponding amounts of cooling on opposite sides of the reflector 2. Since the heat delivered to and removed from the bottom of the reflector 2 is substantially equal to the heat delivered to and removed from the top of the reflector, the distribution of heat within the reflector is generally symmetric from the top to the bottom of the reflector. As a result, global curvature is reduced and may be substantially eliminated.

Figure 12:
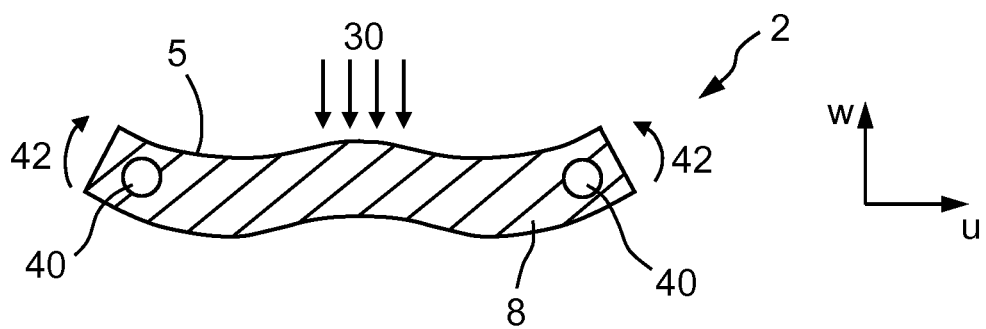
FIG. 12 schematically shows in cross-section a reflector according to an alternative embodiment of the invention.
Figure 13:
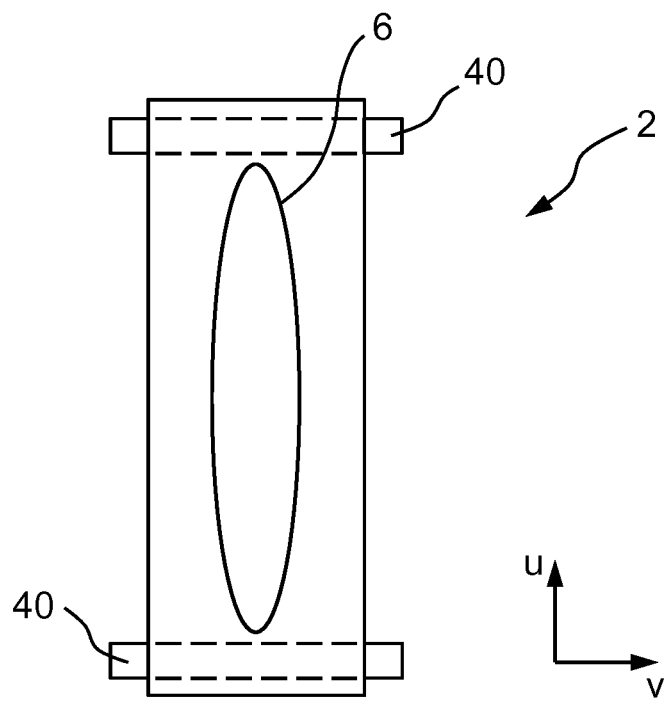
FIG. 13 schematically shows the reflector of FIG. 12 viewed from above.

A reflector 2 according to an alternative embodiment of the invention is shown schematically in cross-section in FIG. 12 and viewed from above in FIG. 13. In this embodiment the reflector 2 is provided with actuators 40 which run along sides of the reflector (or adjacent to sides of the reflector). The reflector 2 comprises a reflective surface 5 supported by a substrate 8. The reflective surface 5 may be provided directly on the substrate 8. Alternatively, the reflective surface may be provided on a plate or other structure which is supported by the substrate (either directly or indirectly). The reflector 2 may for example include features of other embodiments (e.g. channels).

The actuators 40 may for example be provided at least partially inside the reflector 2. The actuators are rotational and rotate to apply torque to the reflector 2 as schematically indicated by arrows 42. Application of torque using the actuators 40 will tend to bend the reflector 2 such that it has cylindrical curvature. The cylindrical curvature may be about the V-direction. As is schematically illustrated, the actuators 40 may apply torque which causes concave bending of the reflector 2.

FIG. 12 shows schematically a radiation beam 30 incident upon the reflector 2. The radiation beam 30 has a footprint 6 schematically shown in FIG. 13. As explained further above, the radiation beam 30 transfers heat to the reflector 2 and this heat may cause both local and global curvature of the reflector. The global curvature of the reflector 2 may comprise concave bending of the reflector. The local curvature of the reflector 2 may comprise a localised bulge where the radiation beam 30 is incident upon the reflector (i.e. bulging at the footprint 6). The actuators 40, by applying torque at sides of the reflector 2 which causes concave bending of the reflector, will partially compensate global curvature of the reflector. The actuators 40 may also partially compensate local curvature of the reflector 2.

Figure 14:
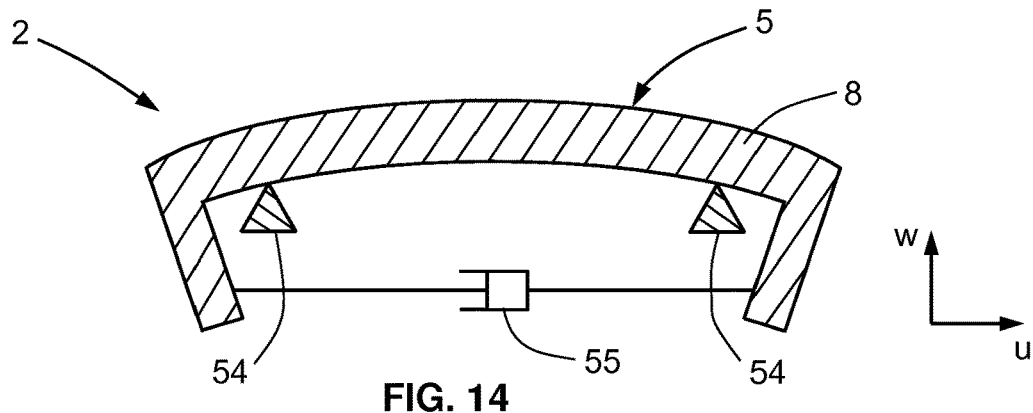
FIG. 14 schematically shows in cross-section a reflector according to an alternative embodiment of the invention.

An alternative embodiment which applies torque which causes concave bending of the reflector 2 is depicted in FIG. 14. In the embodiment of FIG. 14 an actuator 55 extends between lips which project downwardly at sides of the reflector 2. The reflector 2 is mounted on mountings 54 which run adjacent to the sides of the reflector 2. The mountings 54 act as pivots about which bending of the reflector may occur. The actuator 55 is arranged to lengthen and shorted as desired. Lengthening the actuator 55 applies torque about the mountings 54 which causes concave bending of the reflector.

Other configurations of actuators and pivots may be used to apply torque which causes concave bending of the reflector 2.

An advantage of the embodiment shown in FIGS. 12 and 13, and the embodiment shown in FIG. 14 is that it is relatively straightforward to implement. The same may be true of other configurations of actuators and pivots used to apply torque which causes concave bending of a reflector. Although such embodiments might not fully eliminate curvature, curvature may be reduced to a level which is acceptable in a desired application (e.g. in a lithographic apparatus or lithographic system). That is, curvature of the part of the reflective surface 5 which reflects the radiation beam 30 may be reduced to a level which is such that allows the reflected radiation beam to be used in lithographic processes. Aberrations caused by the reflector 2 may be below a threshold level.

Figure 15:
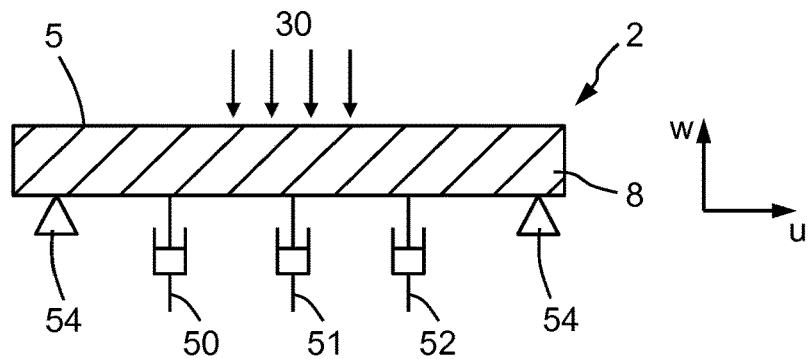
FIG. 15 schematically shows in cross-section a reflector according to an alternative embodiment of the invention.
Figure 16:
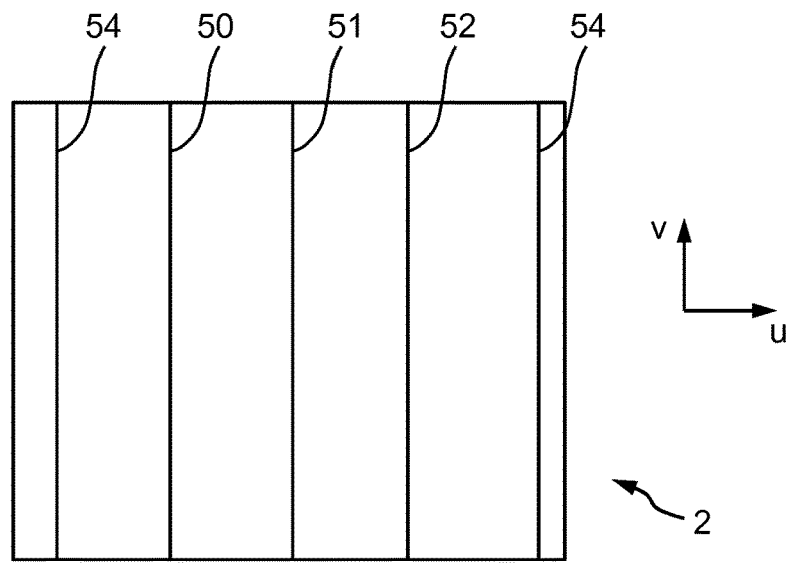
FIG. 16 schematically shows the reflector of FIG. 15 viewed from below.

FIG. 15 shows a reflector 2 according to an alternative embodiment of the invention schematically in cross-section, and FIG. 16 shows the reflector viewed from below. The reflector 2 comprises a reflective surface 5 supported by a substrate 8. The reflective surface 5 may be provided directly on the substrate 8. Alternatively, the reflective surface may be provided on a plate or other structure which is supported by the substrate (either directly or indirectly). The reflector 2 may for example include features of other embodiments (e.g. channels).

In this embodiment three linear actuators 50-52 extend along the reflector 2 in the V-direction. The linear actuators 50-52 may extend along the length of the reflector 2. The linear actuators 50-52 are configured to apply force which pushes the bottom of the reflector 2 upwards or pulls it downwards (the terms 'upwards' and 'downwards' are used here for convenience in connection with the reflector orientation shown in FIG. 15 and are not intended to be limiting). The reflector 2 is mounted on mountings 54 which run adjacent to the sides of the reflector 2. The mountings 54 act as pivots about which bending of the reflector may occur.

When a radiation beam 30 is incident upon the reflector 2, this will cause the centre of the reflector 2 to curve upwards (global curvature). The central actuator 51 pulls downwards on the reflector 2 to at least partially compensate for the force causing upward curving of the reflector. The actuators 50, 52 on either side of the central actuator 51 may push the reflector 2 upwards in order to partially compensate for the downward force applied by the central actuator 51. The actuators 50, 52 on either side of the central actuator 51 may be located outside of the footprint of the radiation beam. This may reduce the extent to which these side actuators 50, 52 apply local curvature which has a negative impact upon properties of the reflected radiation beam. The linear actuators 50-52 apply force which will least partially counteract outward bending and/or bulging of the reflective surface 5 of the reflector 2.

In a simplified embodiment a single actuator may be used. For example, the central actuator 51 may be used to pull downwards on the reflector 2, and the other actuators 50, 52 may be omitted. This may provide some correction of global curvature. The use of more than one actuator (e.g. three actuators) is advantageous because it allows a more complex force profile to be applied to the reflector 2 than is the case if only a single actuator were to be present. The three actuators may at least partially compensate for some local curvature (outward bulging of the reflective surface 5) in addition to at least partially compensating for global local curvature of the reflector 2. The forces applied by the actuators 50-52 may partially compensate for each other, such that the net force applied at the mountings 54 is reduced (compared with the force that would be applied if only the central actuator 51 was present). More than three actuators may be provided, for example to provide a more complex force profile to be applied.

Figure 17:
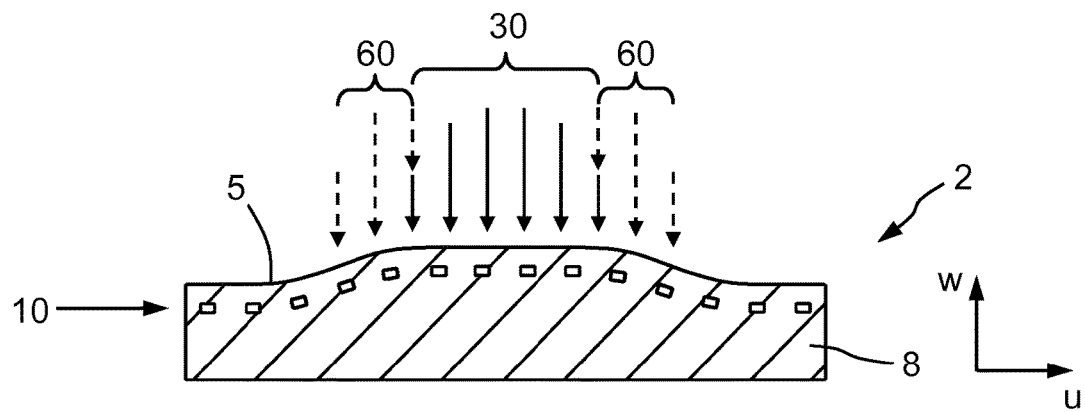
FIG. 17 schematically shows in cross-section a reflector according to an alternative embodiment of the invention.
Figure 18:
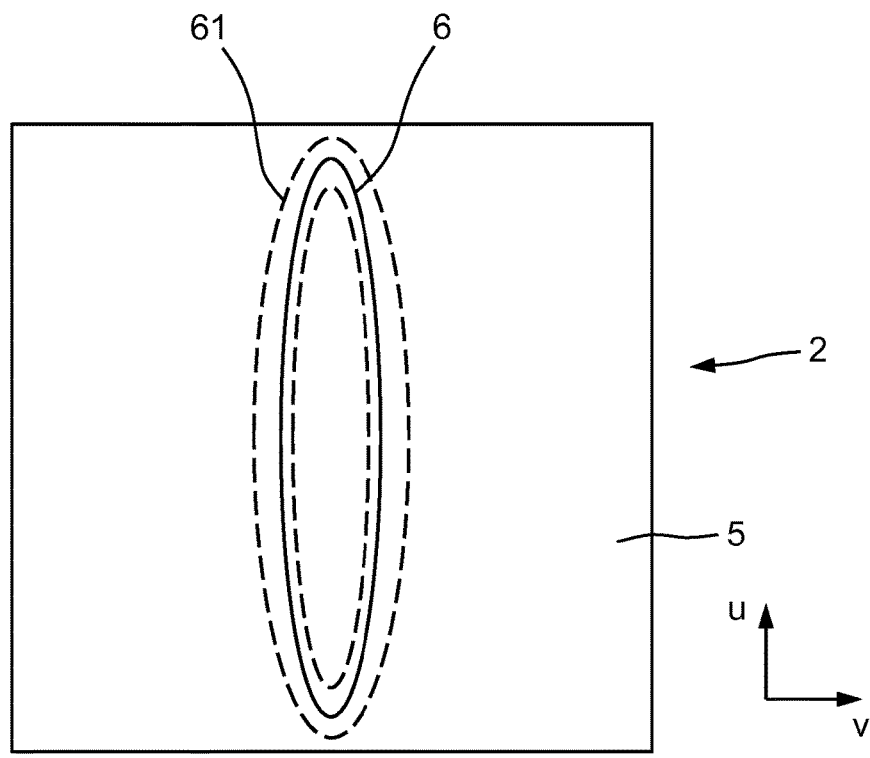
FIG. 18 schematically shows the reflector of FIG. 17 viewed from above.

FIG. 17 shows schematically a reflector 2 according to an alternative embodiment of the invention in cross-section, and FIG. 18 shows the embodiment viewed from above. The reflector 2 comprises a reflective surface 5 supported by a substrate 8. In the illustrated embodiment the reflector 2 includes a cooling channel array 10 provided beneath the reflective surface 5 of the reflector. The cooling channel array 10 may for example correspond with the cooling channel array depicted in FIGS. 5-9. In an alternative arrangement the cooling channel array 10 may be absent from this embodiment. The reflective surface 5 may be provided directly on the substrate 8. Alternatively, the reflective surface may be provided on a plate or other structure which is supported by the substrate (either directly or indirectly).

A radiation beam delivers heat to a central area of the reflector 2. The radiation beam 30 is illustrated schematically by solid arrows. As noted above, the radiation beam will cause local curvature of the reflecting surface 5. In the embodiment shown in FIGS. 17 and 18 a heat load is provided on the reflector using an additional radiation beam 60 generated by an additional radiation beam source (not shown). The additional radiation beam 60 is illustrated schematically by dotted arrows in FIG. 17.

The additional radiation beam 60 is incident upon, and delivers heat to, a region 61 of the reflective surface 5 which surrounds or substantially surrounds the footprint 6 of the radiation beam 30. Inner and outer boundaries of the region 61 are schematically indicated by dotted lines in FIG. 18. The region 61 of the reflective surface 5 upon which the additional radiation beam 60 is incident may be partially outside of the footprint 6 of the radiation beam and may partially overlap with the footprint of the radiation beam.

The additional radiation beam 60 heats the region upon which it is incident such that it has substantially the same temperature as the region which is heated by the radiation beam 30.

The incident radiation beam 30 has an intensity which reduces gradually at edges of the radiation beam (i.e. the radiation beam does not have the form of a so-called 'top-hat' function but has some other form such as a Gaussian function). This is schematically illustrated by shorter solid arrows at edges of the radiation beam 30. As a result, the reflector 2 may receive a reduced amount of heat at edges of the radiation beam 30 (i.e. at edges of the footprint 6). The additional radiation beam 60 may be provided with a lower intensity at regions where it overlaps with lower intensity edges of the radiation beam 30 on the reflector 2. The intensity of the additional radiation beam 60 may be arranged such that the total heat delivered to the reflector 2 by the combination of the radiation beam 30 and the additional radiation beam 60 is substantially constant at locations where these overlap. Thus, the intensity of the additional radiation beam 60 is higher at locations where the intensity of the radiation beam 30 is lower, and the intensity of the additional radiation beam 60 is lower at locations where the intensity of the radiation beam 30 is higher.

Because the region 61 surrounding (or substantially surrounding) the radiation beam 30 is heated to substantially the same temperature as the region heated by the radiation beam 30, local curvature of the reflective surface is prevented or reduced. As depicted, a central portion of the reflector 2 is substantially free of local curvature, with local curvature having been moved outwards to a position which is outside of the footprint of the radiation beam 30.

The additional radiation beam source may for example provide the additional radiation beam 60 as a scanning radiation beam which is scanned over locations on the reflector 2 which are to be heated. The additional radiation beam may, for example, be infrared (e.g. with a wavelength of 1.05 µm or 10.6 µm). High-power lasers are readily available at these wavelengths. Alternatively, the additional radiation beam 60 may be ultraviolet (e.g. with a wavelength of 192 nm) for example generated using a laser. Using an ultraviolet wavelength may provide more efficient heating of the reflector 2 because the metallic reflective surface 5 may have a higher absorption coefficient at ultraviolet wavelengths than at infrared wavelengths.

In an embodiment, the additional radiation beam 60 may be an electron beam. The electron beam may be scanned, for example, using the mechanism used to scan electron beams in cathode ray tube television sets.

Embodiments of the invention refer to using water to transfer heat from the reflector 2. However, any suitable liquid may be used. In an embodiment, liquid methane or some other suitable cryogenic coolant may be used. An advantage of using a cryogenic coolant is that at cryogenic temperatures the coefficient of thermal expansion of silicon is lower and the thermal conductivity of silicon is higher. At a temperature of 123K the coefficient of thermal expansion of silicon is zero and the thermal conductivity is around is a factor of 6 or greater (compared with room temperature). Cooling the reflector 2 to a temperature around 123K is therefore advantageous.

When cooling using a cryogenic coolant, two-phase cooling may occur (i.e. heat absorbed by the cryogenic liquid may turn the cryogenic liquid into gas). The cryogenic cooling may be significantly more efficient than cooling using, for example, water.

A metallic surface may be provided on the top surface of the reflector 2 for any embodiment of the invention. The metallic surface may provide the reflective surface 5 of the reflector.

A reflector according to an embodiment of the invention may be a diffraction grating or may be a mirror.

Features of different embodiments of the invention may be combined together. For example, a cooling channel array may be provided in any of the embodiments of the invention.

The lithographic system LS may comprise any number of lithographic apparatus. The number of lithographic apparatus which form a lithographic system LS may, for example, depend on the amount of radiation which is output from a free electron laser and on the amount of radiation which is lost in the beam delivery system BDS. The number of lithographic apparatus which form a lithographic system LS may additionally or alternatively depend on the layout of a lithographic system LS and/or the layout of a plurality of lithographic systems LS.

Embodiments of a lithographic system LS may also include one or more mask inspection apparatus MIA and/or one or more Aerial Inspection Measurement Systems (AIMS). In some embodiments, the lithographic system LS may comprise two mask inspection apparatuses to allow for some redundancy. This may allow one mask inspection apparatus to be used when the other mask inspection apparatus is being repaired or undergoing maintenance. Thus, one mask inspection apparatus is always available for use. A mask inspection apparatus may use a lower power radiation beam than a lithographic apparatus. Further, it will be appreciated that radiation generated using a free electron laser FEL of the type described herein may be used for applications other than lithography or lithography related applications.

The term "relativistic electrons" should be interpreted to mean electrons which have relativistic energies. An electron may be considered to have a relativistic energy when its kinetic energy is comparable to or greater than its rest mass energy (511 keV in natural units). In practice a particle accelerator which forms part of a free electron laser may accelerate electrons to energies which are much greater than its rest mass energy. For example a particle accelerator may accelerate electrons to energies of >10 MeV, >100 MeV, >1 GeV or more.

The radiation source SO may comprise one or more free electron lasers FEL which are operable to produce a beam of EUV radiation. It will be appreciated however that in other embodiments, the radiation source SO may comprise other means of generating radiation. For example, the radiation source SO may comprise one or more "laser produced plasma" (LPP) sources. Indeed, it is to be understood that in some embodiments, the radiation source SO may utilise any means operable to provide a radiation beam suitable for lithography.

Embodiments of the invention have been described in the context of a free electron laser FEL which outputs an EUV radiation beam. However a free electron laser FEL may be configured to output radiation having any wavelength. Some embodiments of the invention may therefore comprise a free electron laser which outputs a radiation beam which is not an EUV radiation beam.

It will be appreciated that the term "grazing incidence angle" refers to the angle between the propagation direction of an incident radiation beam and a reflective surface that it is incident upon. This angle is complementary to the angle of incidence, i.e. the sum of the grazing incidence angle and the angle of incidence is a right angle. The grazing incidence angle may for example be around 5 degrees or less.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm. Embodiments of the invention may use non-EUV radiation (e.g. may use DUV radiation).

The lithographic apparatuses $LA_a$ to $LA_n$ may be used in the manufacture of ICs. Alternatively, the lithographic apparatuses $LA_a$ to $LA_n$ described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A reflector comprising:
a plate supported by a substrate,
wherein the plate has a reflective surface and the plate is secured to the substrate by, adhesive free bonding,
wherein a cooling channel array is provided in the reflector,
wherein channels of the cooling channel array are formed from open channels in a surface of the substrate, the open channels being closed by an intermediate plate to create the channels, and
wherein the reflector further comprises a second cooling channel array, channels of the second cooling channel array being formed from open channels in the intermediate plate, the open channels being closed by the plate.

2. The reflector of claim 1, wherein the adhesive free bonding between the plate and the substrate comprises direct bonding or optical contact bonding.

3. The reflector of claim 1, wherein the substrate is an intermediate substrate which is secured by a layer of adhesive to a further substrate.

4. The reflector of claim 3, wherein the intermediate substrate has a thickness of around 2 mm or less.

5. The reflector of claim 1, wherein the plate and the substrate are formed from the same material.

6. The reflector of claim 5, wherein the material comprises silicon, SiSiC, SiC, copper, Sapphire, aluminum, or nickel.

7. The reflector of claim 1, wherein the plate and the substrate are formed from different materials.

8. The reflector of claim 7, wherein the plate comprises silicon, SiC, copper, or aluminum.

9. The reflector of claim 7, wherein the substrate comprises zerodur, cordierite, ULE, quartz, or invar.

10. The reflector of claim 1, wherein each channel has a width of 250 microns or more.

11. The reflector of claim 1, wherein each of the channels has a width of less than 1 mm.

12. The reflector of claim 1, wherein the size of each side of a channel of the channels, when viewed in cross-section, is less than 1000 microns.

13. The reflector of claim 1, wherein the channels of the cooling channel array are generally rectangular in cross-section.

14. The reflector of claim 1, wherein the plate is secured upon a curved surface of the substrate.

15. The reflector of claim 1, wherein the reflective surface of the plate is curved and an opposite surface of the plate is flat.

16. The reflector of claim 1, further comprising:
   an inlet conduit configured to deliver liquid to the cooling channel array; and
   an outlet conduit configured to remove liquid from the cooling channel army.

17. The reflector of claim 1, wherein the reflector is a mirror or a diffraction grating.

18. The reflector of claim 1, wherein the reflective surface of the plate comprises a metallic layer.

19. The reflector of claim 1, wherein the plate which closes the open channels in the intermediate plate is the plate with the reflective surface.

* * * * *